US008778771B2

(12) United States Patent
Kokumai (10) Patent No.: US 8,778,771 B2
(45) Date of Patent: Jul. 15, 2014

(54) SEMICONDUCTOR DEVICE, METHOD OF MANUFACTURING THE SAME, AND SOLID-STATE IMAGE SENSOR

(75) Inventor: Kazuo Kokumai, Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 59 days.

(21) Appl. No.: 13/163,188

(22) Filed: Jun. 17, 2011

(65) Prior Publication Data

US 2012/0001291 A1     Jan. 5, 2012

(30) Foreign Application Priority Data

Jun. 30, 2010    (JP) ................................ 2010-150256

(51) Int. Cl.
*H01L 21/76* (2006.01)
*H01L 27/146* (2006.01)
*H01L 31/0352* (2006.01)
*H01L 21/30* (2006.01)

(52) U.S. Cl.
CPC ...... *H01L 31/0352* (2013.01); *H01L 27/14645* (2013.01); *H01L 27/14689* (2013.01); *H01L 27/14609* (2013.01); *H01L 27/1464* (2013.01)
USPC ........... 438/400; 438/409; 438/423; 438/455; 438/458; 438/459; 257/E21.57; 257/E21.151; 257/E21.273; 257/E21.568

(58) Field of Classification Search
USPC ......... 438/400, 408, 409, 423, 455, 458, 459; 257/E33.018, E31.013, E21.57, 257/E21.151, E21.273, E21.568
See application file for complete search history.

(56) References Cited

U.S. PATENT DOCUMENTS

| 5,458,755 | A | * | 10/1995 | Fujiyama et al. | 204/224 R |
|---|---|---|---|---|---|
| 5,705,840 | A | * | 1/1998 | Shen et al. | 257/344 |
| 5,950,094 | A | * | 9/1999 | Lin et al. | 438/409 |
| 6,653,209 | B1 | * | 11/2003 | Yamagata | 438/459 |
| 7,148,119 | B1 | * | 12/2006 | Sakaguchi et al. | 438/406 |
| 7,518,144 | B2 | | 4/2009 | Hirata et al. | |
| 7,566,482 | B2 | * | 7/2009 | Choe et al. | 427/526 |
| 8,390,707 | B2 | | 3/2013 | Yamashita | |
| 2006/0166468 | A1 | * | 7/2006 | Yonehara et al. | 438/483 |
| 2007/0096215 | A1 | * | 5/2007 | Chidambarrao et al. | 257/368 |
| 2010/0167453 | A1 | * | 7/2010 | Kim et al. | 438/65 |

FOREIGN PATENT DOCUMENTS

| JP | 10-270674 A | 10/1998 |
|---|---|---|
| JP | 2001-168308 A | 6/2001 |
| JP | 2001-257337 | 9/2001 |
| JP | 2007-227761 A | 9/2007 |
| JP | 2008-66410 A | 3/2008 |
| JP | 2009-206356 A | 9/2009 |

* cited by examiner

*Primary Examiner* — Galina Yushina
(74) *Attorney, Agent, or Firm* — Fitzpatrick, Cella, Harper and Scinto

(57) ABSTRACT

A method of manufacturing a semiconductor device includes steps of providing a substrate including a semiconductor portion, a non-porous semiconductor layer, and a porous semiconductor layer arranged between the semiconductor portion and the non-porous semiconductor layer, forming a porous oxide layer by oxidizing the porous semiconductor layer, forming a bonded substrate by bonding a supporting substrate to a surface, on a side of the non-porous semiconductor layer, of the substrate on which the porous oxide layer is formed, and separating the semiconductor portion from the bonded substrate by utilizing the porous oxide layer.

4 Claims, 12 Drawing Sheets

SEMICONDUCTOR DEVICE, METHOD OF MANUFACTURING THE SAME, AND SOLID-STATE IMAGE SENSOR

BACKGROUND OF THE INVENTION

1. Field of the Invention

The present invention relates to a semiconductor device, a method of manufacturing the same, and a solid-state image sensor.

2. Description of the Related Art

As a solid-state image sensor such as a CCD or CMOS sensor, a back-side illumination solid-state image sensor capable of achieving higher sensitivity has been proposed. The back-side illumination solid-state image sensor has a photoelectric conversion element such as a photodiode on the front-side surface of a semiconductor substrate such as silicon, and uses the photoelectric conversion element to detect light incident on the back-side surface of the semiconductor substrate. However, if the semiconductor substrate is too thick, the incident light is absorbed in the substrate en route to the photoelectric conversion element, so a sufficient amount of light cannot reach the photoelectric conversion element. Hence, it is necessary to reduce the thickness of a semiconductor substrate having a photoelectric conversion element formed on its front-side surface, by thinning the semiconductor substrate from its back-side surface, to a target thickness. Japanese Patent Laid-Open No. 2001-257337 proposes a method of manufacturing such a solid-state image sensor.

Japanese Patent Laid-Open No. 2001-257337 describes a method of forming an image sensing element in an epitaxial layer formed on a porous silicon layer, and then separating a semiconductor substrate from the image sensing element using the porous silicon layer. However, the porous silicon layer is vulnerable, so especially when a relatively large semiconductor substrate is used, the semiconductor substrate may be separated upon collapse of the porous silicon layer while an image sensing element is formed in the epitaxial layer.

SUMMARY OF THE INVENTION

The present invention provides a technique that is advantageous to improve the yield in a method of manufacturing a semiconductor device, which includes the step of reducing the thickness of a substrate by utilizing a porous layer.

One of the aspects of the present invention provides a method of manufacturing a semiconductor device, comprising the steps of: providing a substrate including a semiconductor portion, a non-porous semiconductor layer, and a porous semiconductor layer arranged between the semiconductor portion and the non-porous semiconductor layer; forming a porous oxide layer by oxidizing the porous semiconductor layer; forming a bonded substrate by bonding a supporting substrate to a surface, on a side of the non-porous semiconductor layer, of the substrate on which the porous oxide layer is formed; and separating the semiconductor portion from the bonded substrate by utilizing the porous oxide layer.

Further features of the present invention will become apparent from the following description of exemplary embodiments with reference to the attached drawings.

DESCRIPTION OF THE EMBODIMENTS

First Embodiment

A method of manufacturing a semiconductor device according to the first embodiment of the present invention will be described with reference to FIGS. 1A to 1D. In step S101, an $n^-$-type silicon layer 2 to serve as an impurity semiconductor layer (non-porous semiconductor layer) is formed on the surface of a $p^-$-type silicon substrate (semiconductor portion) 1. The $n^-$-type silicon layer 2 can be formed by, for example, epitaxial growth at a temperature of 900 to 1,200° C. and a pressure of 1.0 to 101.3 kPa upon adding phosphine ($PH_3$) to a silane-based gas or a mixed gas containing a silane-based gas/hydrogen gas. As the silane-based gas, monosilane ($SiH_4$), dichlorosilane ($SiH_2Cl_2$), trichlorosilane ($SiHCl_3$), silicon tetrachloride ($SiCl_4$), or disilane ($Si_2H_6$), for example, can be used. The $n^-$-type silicon layer 2 may be formed by, for example, implanting impurity ions such as phosphorus ions or arsenic ions into the $p^-$-type silicon substrate 1, instead of using epitaxial growth.

Figure 1A:
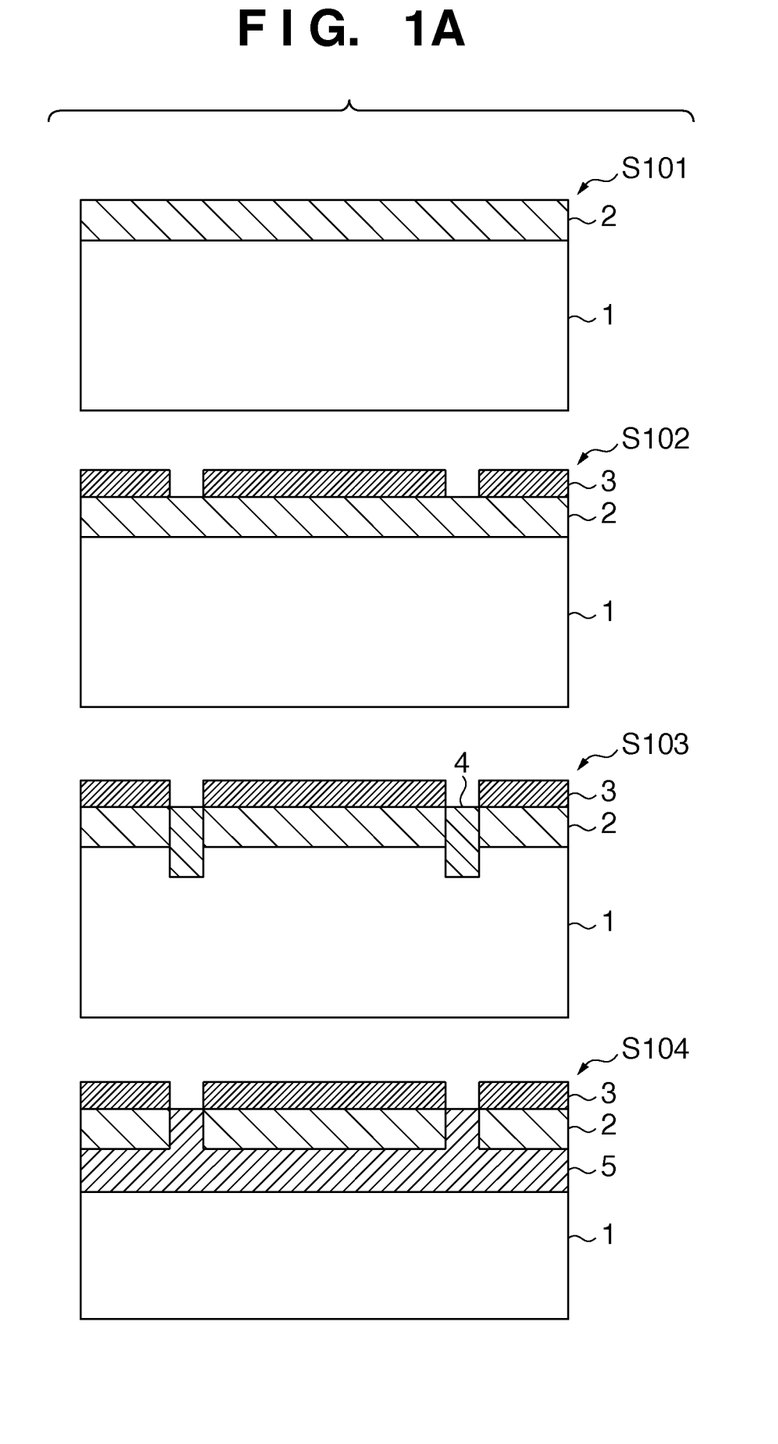
FIG. 1A is a view showing a step in a method of manufacturing a semiconductor device according to the first embodiment of the present invention.

In step S102, silicon nitride 3 is deposited on the $n^-$-type silicon layer 2, then a resist pattern (not shown) is formed on it, and the silicon nitride 3 is partially etched using the resist pattern as a mask to expose a partial region of the $n^-$-type silicon layer 2. The silicon nitride 3 can have a thickness of, for example, about 50 to 300 nm. The silicon nitride 3 can be formed, for example, using a mixed gas containing ammonia and monosilane or dichlorosilane at a temperature of 700 to 900° C. and a pressure of 5 to 100 Pa. The silicon nitride 3 can be etched by, for example, plasma etching which uses a chlorofluorocarbon-based gas such as tetrafluoromethane ($CF_4$), difluoromethane ($CH_2F_2$), trifluoromethane ($CHF_3$), or sulfur hexafluoride ($SF_6$). These chlorofluorocarbon-based gases can be used solely or in combination with another chlorofluorocarbon-based gas or even be used in mixture with an inert gas such as argon or helium.

In step S103, ions are implanted into the $p^-$-type silicon substrate 1 using the resist pattern (not shown) and the silicon nitride 3 as a mask to form a $p^+$-type silicon region 4 to serve as an impurity semiconductor region. The $p^+$-type silicon region 4 to serve as an impurity semiconductor region is formed such that its lower end is present at a position lower than the upper end of the $p^-$-type silicon substrate 1. That is, the $p^+$-type silicon region 4 is formed to reach the $p^-$-type silicon substrate 1 upon extending through the $n^-$-type silicon layer 2 to serve as an impurity semiconductor layer. To distinguish different conductivity types: p and n types, p type is assumed as a first conductivity type, and n type is assumed as a second conductivity type. Under this assumption, the $p^+$-type silicon region 4 and $p^-$-type silicon substrate 1 have the first conductivity type, and the $n^-$-type silicon layer 2 has the second conductivity type. However, it is also possible to assume p type as a second conductivity type and n type as a first conductivity type.

Examples of the implanted ions are boron ions or boron difluoride ($BF_2$) ions. After ion implantation, the resist pattern may be removed and annealing may be performed at a temperature of 900 to 1,300° C. to activate the implanted ions. After ion activation, the $p^+$-type silicon region 4 to serve as an impurity semiconductor region can have a specific resistance of, for example, 0.01 to 0.05 Ω·cm.

In step S104, the resist pattern is removed, and then the $p^+$-type silicon region 4 and part of the $p^-$-type silicon substrate 1 are anodized using the silicon nitride 3 as a mask to transform the part of the $p^-$-type silicon substrate 1 into a first porous silicon layer (first porous semiconductor layer) 5. At this time, the $n^-$-type silicon layer 2 forms no porous structure. This is because a p-type silicon layer is more likely to form a porous structure because it has excess holes (deficient electrons), while an n-type silicon layer is less likely to form a porous structure because it has excess electrons (deficient holes). That is, the ease of porous structure formation can be controlled using a difference in at least one of the carrier type and amount. Anodization (porous structure formation) can be performed, for example, at a current density of 0.5 to 300 mA/$cm^2$ in a mixed solution containing, for example, hydrofluoric acid (HF) and an alcohol such as ethanol or IPA (isopropyl alcohol).

Figure 1B:
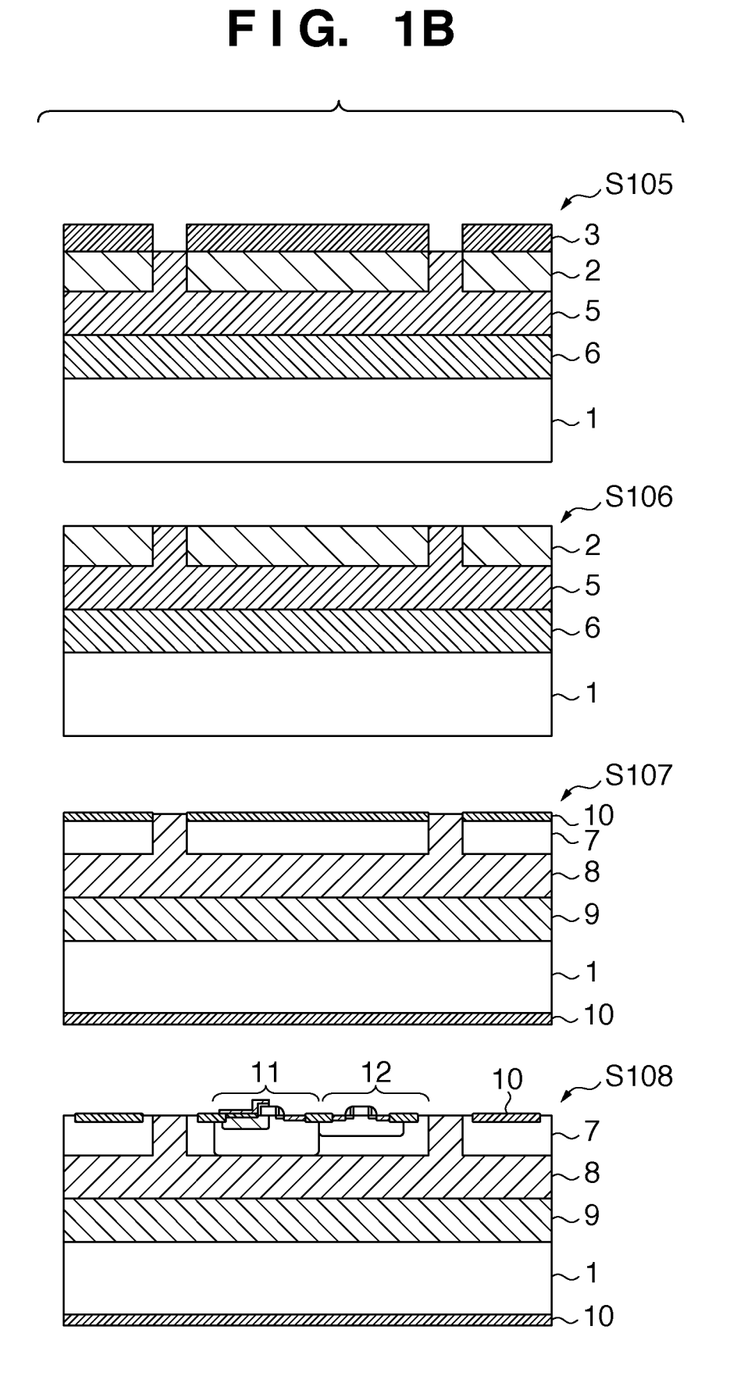
FIG. 1B is a view showing a step in the method of manufacturing a semiconductor device according to the first embodiment of the present invention.

In step S105, a second porous silicon layer (second porous semiconductor layer) 6 with a pore density different from that of the first porous silicon layer 5 is formed under it by the second anodization operation. Part of the $p^-$-type silicon substrate 1 is thus transformed into the second porous silicon layer 6. By changing the current density applied in anodization, the pore density can be changed. Typically, in step S105, anodization is performed at a current density higher than that used in step S104. Thus, a porous silicon layer 6 with a pore density higher than the porous silicon layer 5 formed in step S104 is obtained.

In step S106, the silicon nitride 3 is separated by etching. Since the $n^-$-type silicon layer 2 exposed after separation of the silicon nitride 3 can also be defined as a single-crystal silicon layer in which a semiconductor element is to be formed, it will be referred to as a single-crystal silicon layer 7 hereinafter. The silicon nitride 3 can be etched by, for example, wet etching which uses thermal phosphoric acid with a temperature of 140 to 180° C. or plasma etching which uses the chlorofluorocarbon-based gas exemplified in reference to step S102.

In step S107, the first porous silicon layer 5 is transformed into a first porous silicon oxide layer (porous oxide layer) 8, and the second porous silicon layer 6 is transformed into a second porous silicon oxide layer (porous oxide layer) 9, both by thermal oxidation. At this time, a silicon oxide film 10 is formed on the single-crystal silicon layer 7. In other words, the upper portion of the $n^-$-type silicon layer 2 in step S106 is oxidized to form a single-crystal silicon layer 7 and silicon oxide film 10. Note that the oxidation rate of porous silicon can be several hundred times that of single-crystal silicon, depending on its porosity. Hence, the entire porous silicon can be oxidized even if single-crystal silicon is oxidized to have a small thickness. Oxidation can be performed, for example, in the presence of oxygen or a mixed gas containing hydrogen/oxygen at normal pressure and a temperature of 900 to 1,150° C. If the $p^+$-type silicon region 4 is placed to divide the single-crystal silicon layer 7 into a plurality of regions (island-shaped regions) in step S103, the single-crystal silicon layer 7 is divided into a plurality of regions (island-shaped regions) by the first porous silicon oxide layer 8 by performing step S107. By oxidizing the porous silicon layers 5 and 6, their mechanical strengths increase, and this makes it possible to prevent the silicon substrate 1 from being separated from the single-crystal silicon layer 7 before the original separating step (S111) of the silicon substrate 1, thus improving the yield.

Figure 1C:
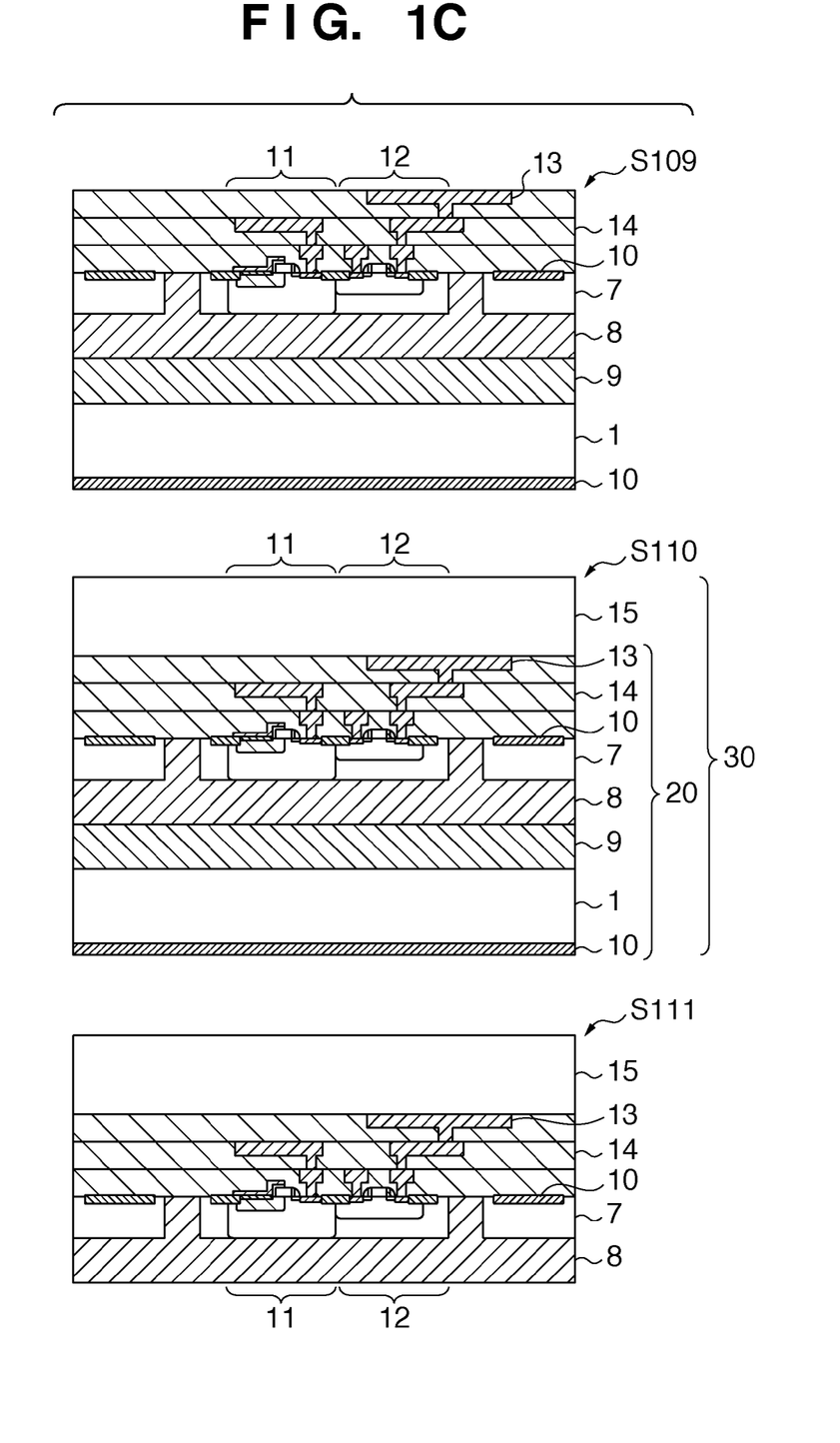
FIG. 1C is a view showing a step in the method of manufacturing a semiconductor device according to the first embodiment of the present invention.

In step S108, a semiconductor element is formed in the single-crystal silicon layer 7. The semiconductor element can be, for example, an element constituting a solid-state image sensor which can be formed by a known CMOS sensor manufacturing process. This element can include, for example, a photodiode 11 and transistor 12.

In step S109, a wiring structure including a wiring pattern 13 and interlayer dielectric film 14 is formed on the single-crystal silicon layer 7. The wiring pattern 13 can be formed by applying, for example, a known multilayer wiring process which uses a metal material such as Al or Cu. Although a protective film such as a plasma nitride film can be formed in the top layer in the normal multilayer wiring process, it is not shown in FIG. 1C.

In step S110, a supporting substrate 15 and a substrate 20 on which a wiring structure including the wiring pattern 13 and interlayer dielectric film 14 is formed are bonded to each other to form a bonded substrate 30. The supporting substrate 15 is formed using, for example, a resin such as plastic, glass, or silicon as its main component, and supports the single-crystal silicon layer 7 and the wiring structure on the side of this wiring structure. The supporting substrate 15 can be bonded to the substrate 20 using an adhesive such as epoxy resin. The supporting substrate 15 may be bonded to the protective film (not shown) formed in the top layer of the substrate 20.

Figure 1D:
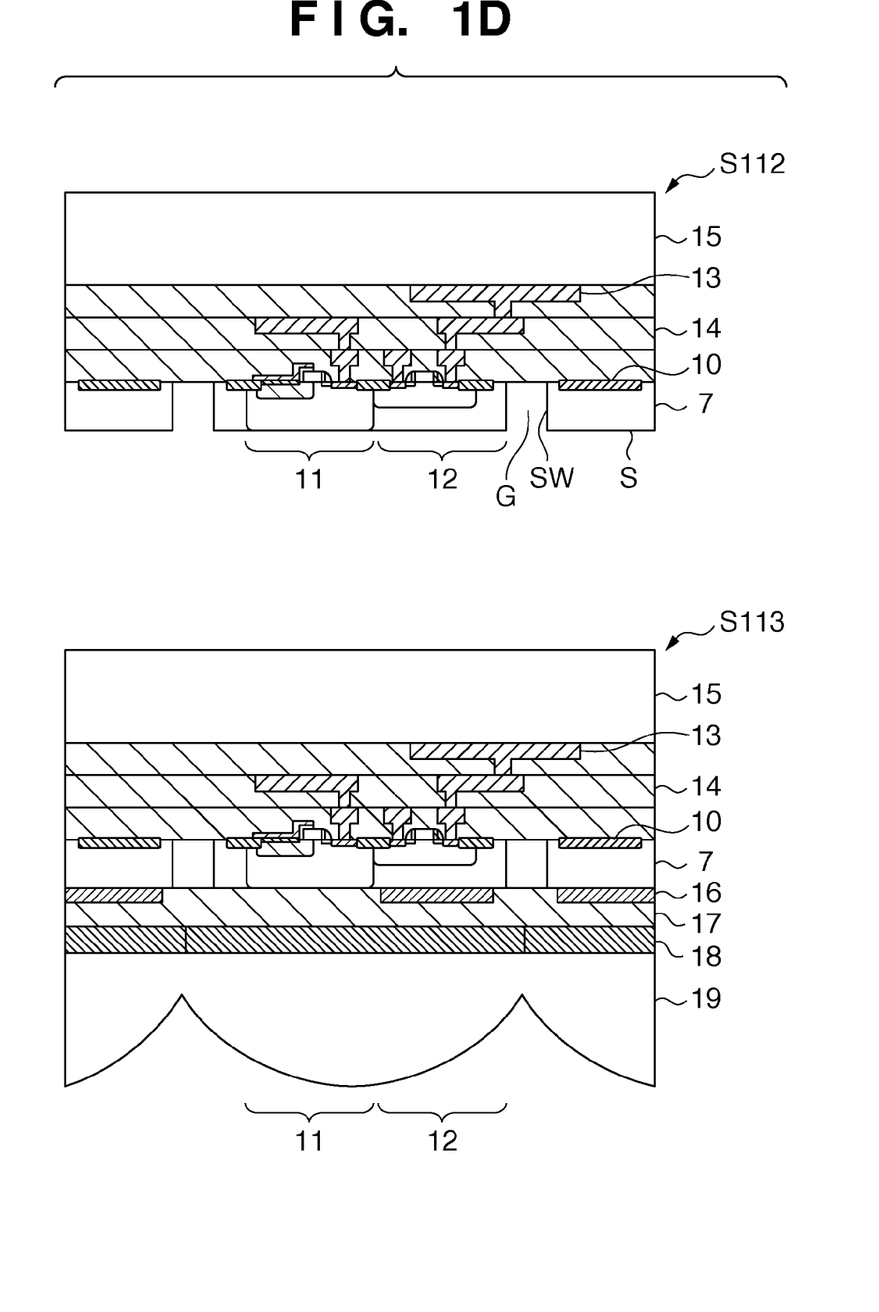
FIG. 1D is a view showing a step in the method of manufacturing a semiconductor device according to the first embodiment of the present invention.

In step S111, the silicon substrate (semiconductor portion) 1 is separated from the bonded substrate 30 by utilizing the first porous silicon oxide layer 8 and second porous silicon oxide layer 9. More specifically, in step S111, the silicon substrate 1 is separated from the structure including the single-crystal silicon layer 7 by, for example, dividing the bonded substrate 30 at the interface between the first porous silicon oxide layer 8 and the second porous silicon oxide layer 9. The porous silicon oxide layers (porous oxide layers) 8 and 9 have different pore densities. Hence, the pore density changes at the interface between the porous silicon oxide layers (porous oxide layers) 8 and 9, so this interface is more mechanically vulnerable than other portions. This makes it possible to separate the silicon substrate 1 from the structure including the single-crystal silicon layer 7 by utilizing the porous silicon oxide layers (porous oxide layers) 8 and 9 (more specifically, by collapsing the whole or part of a region near the interface between the porous silicon oxide layers 8 and 9). Separation can be performed by, for example, blowing an electrolytic solution with a pressure of 20 to 60 MPa from a 0.1-mm diameter nozzle to the edge of the silicon substrate 1 to divide the substrate 20 at the interface between the first porous silicon oxide layer 8 and the second porous silicon oxide layer 9. It is also possible to separate the silicon substrate 1 by, for example, applying ultrasound to the substrate 20 in water or a solution such as an alcohol. Note that the first porous silicon oxide layer 8 and second porous silicon oxide layer 9 have mechanical strengths higher than the first porous silicon layer 5 and second porous silicon layer 6, respectively. This makes it possible to suppress separation of the silicon substrate 1 in forming semiconductor elements such as the photodiode 11 and transistor 12. On the other hand, in the original separating step of the silicon substrate 1, the silicon substrate 1 can easily be separated using a method of, for example, blowing a fluid such as an electrolytic solution, water, or an alcohol, or ultrasound application. In place of a porous silicon oxide layer having a double-layered structure including the first porous silicon oxide layer 8 and second porous silicon oxide layer 9, a porous silicon oxide layer having a single-layered structure or a multilayered structure including three or more layers may be formed and utilized to separate the silicon substrate 1.

In step S112, the first porous silicon oxide layer 8 is removed from the single-crystal silicon layer 7. The porous silicon oxide layer 8 can be removed by, for example, selectively etching the porous silicon oxide layer 8 using a sheet-fed cleaning device and 0.5% hydrofluoric acid (HF). As a chemical solution used to selectively etch the porous silicon oxide layer 8, any solution such as ammonium fluoride solution or a mixed solution containing hydrofluoric acid and hydrogen peroxide is applicable as well as hydrofluoric acid so long as it contains fluorine ions. By removing the first porous silicon oxide layer 8, a surface S and side surfaces SW of the single-crystal silicon layer 7 are exposed and gaps G are formed.

In step S113, a light-shielding film 16 such as a tungsten film, a light-transmitting planarization layer 17, a color filter 18, and a microlens 19, for example, are formed on the single-crystal silicon layer 7. With the above-mentioned procedure, a semiconductor device having a thin silicon layer can be obtained. Note that the gaps G are surrounded by the wiring structure, the single-crystal silicon layer 7, and the planarization layer 17.

The semiconductor device according to the first embodiment can be, for example, a back-side illumination solid-state image sensor having, as its light incident surface, a surface on which a porous silicon oxide layer is formed. Since the first embodiment can reduce the thickness of a single-crystal semiconductor layer with high accuracy, it is useful in providing a large-area, high-sensitivity back-side illumination solid-state image sensor at a high yield. This is to selectively remove the porous silicon oxide layer 8 from the single-crystal silicon layer 7 by etching. Note that if a thickness reduction is done by lapping, polishing such as CMP, or grinding which uses, for example, a grinder, mechanical damage such as a scratch or a crack may be inflicted on the single-crystal semiconductor layer. Also, if a thickness reduction is done by dry etching which uses, for example, a plasma, charges, for example, are likely to be generated in the single-crystal semiconductor layer, so electrical damage may be inflicted on the element. Hence, a thickness reduction is preferably done by wet etching. In this case, less mechanical/electrical damage is inflicted on the element, thus making it possible to manufacture a semiconductor device such as a back-side illumination solid-state image sensor at a high yield.

The formation positions of the porous silicon oxide layer 8 in a direction parallel to the surface S of the single-crystal silicon layer 7, that is, the positions of the gaps G, at which the single-crystal silicon layer 7 is absent, are not limited to specific positions. When, for example, a solid-state image sensor having a plurality of pixels, such as a back-side illumination solid-state image sensor, is manufactured as a semiconductor device, the positions of the gaps G in the single-crystal silicon layer 7 can be determined such that pixels are isolated from each other, in order to prevent signal crosstalk between adjacent pixels. It is also possible to use the positions, at which the side surfaces SW of the single-crystal silicon layer 7 are exposed, as scribe lines in dicing which uses, for example, a blade or a laser. This makes it possible to obtain the same effect as in half-cut dicing used to prevent, for example, chipping of a thin silicon layer.

In the method described in Japanese Patent Laid-Open No. 2001-257337, the semiconductor substrate is separated on the separation surface of the porous silicon layer, and then the porous silicon layer remaining on its back-side surface is selectively removed by a mixed solution containing hydrofluoric acid and nitric acid. Note that this mixed solution is known as a silicon etching solution, and the entire porous silicon layer is removed by etching a thin silicon column, but the thickness of the single-crystal silicon layer reduces only by that of the silicon column. Nevertheless, it is a common practice to perform overetching in order to sufficiently remove the residual on the substrate surface in the step of etching the porous silicon layer, so the single-crystal silicon layer can be overetched by about several ten to several hundred nanometers. Especially in a back-side illumination solid-state image sensor, an impurity semiconductor layer is formed in the back-side surface of a silicon substrate, that serves as its light incident surface, by a depth of about several ten to several hundred nanometers, this surface becomes a surface which undergoes the above-mentioned overetching. Therefore, the thickness of the impurity semiconductor layer is reduced upon etching and may be removed, depending on circumstances involved.

However, as the porous silicon oxide layer 8 can be selectively etched and separated from the single-crystal silicon layer 7 formed under it, the thickness of the single-crystal silicon layer 7 can be uniformly reduced with high accuracy. This makes it possible to improve not only the performance of a semiconductor device such as a back-side illumination solid-state image sensor but also that of a semiconductor device having a thin semiconductor layer, such as an MEMS element having a thin membrane or a cantilever.

Second Embodiment

Figure 2:
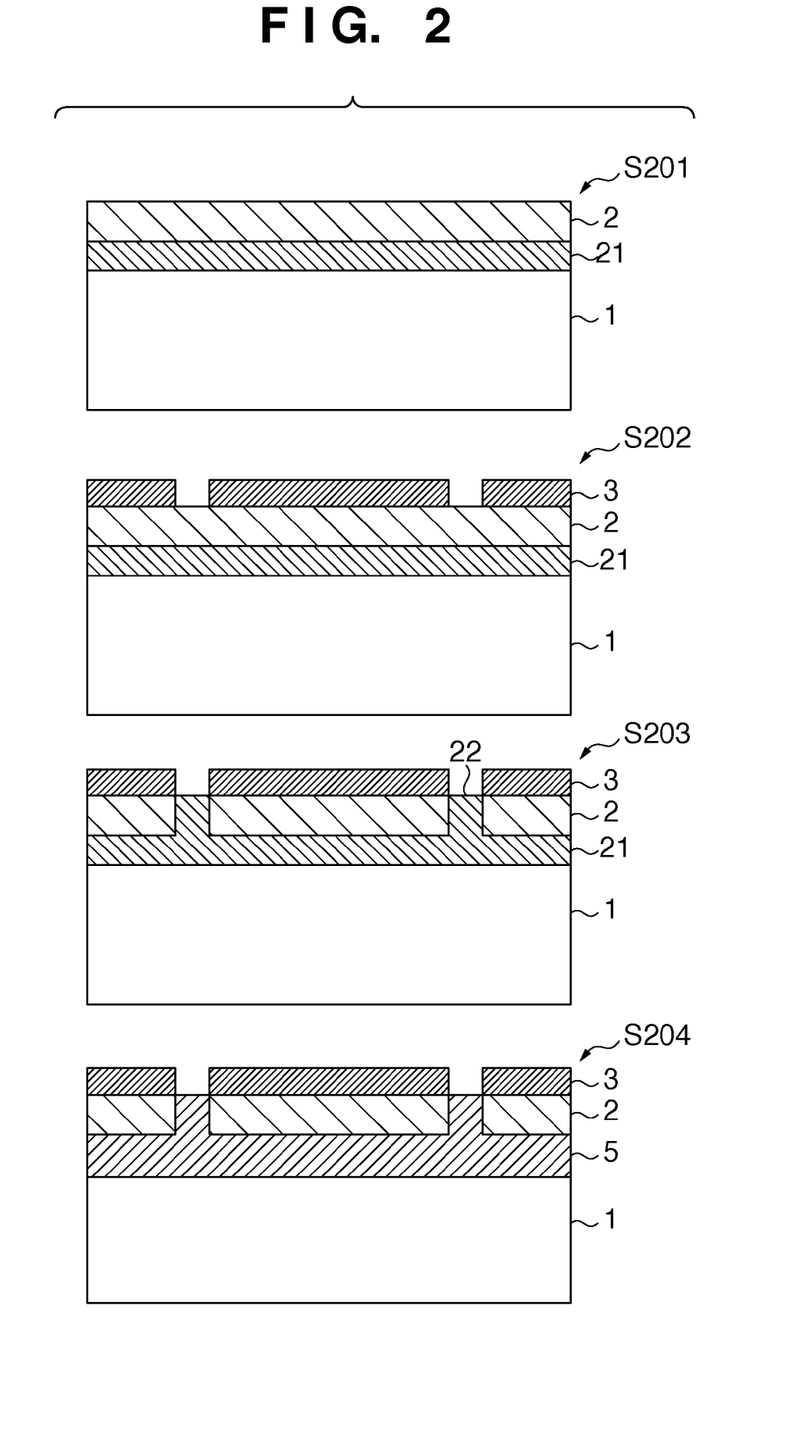
FIG. 2 shows views of steps in a method of manufacturing a semiconductor device according to the second embodiment of the present invention.

A method of manufacturing a semiconductor device according to the second embodiment of the present invention will be described with reference to FIG. 2. In step S201, a $p^+$-type silicon layer 21 to serve as a first impurity semiconductor layer and an $n^-$-type silicon layer 2 to serve as a second impurity semiconductor layer are formed on the surface of a $p^-$-type silicon substrate 1 in this order. The $p^+$-type silicon layer 21 and $n^-$-type silicon layer 2 can be formed by, for example, the epitaxial growth method. Note that the $p^+$-type silicon layer 21 can be obtained by adding diborane ($B_2H_5$) to a silane-based gas, and the n⁻-type silicon layer 2 can be obtained by adding phosphine to a silane-based gas. Each impurity semiconductor layer can also be formed by a method other than epitaxial growth, such as ion implantation.

In step S202, silicon nitride 3 is deposited on the n⁻-type silicon layer 2, then a resist pattern (not shown) is formed on it, and the silicon nitride 3 is partially etched to partially expose the n⁻-type silicon layer 2. This step can be performed under the same conditions as in step S102.

In step S203, an impurity is implanted into a partial region of the n⁻-type silicon layer 2 using the resist pattern (not shown) and the silicon nitride 3 as a mask. With this step, a partial region of the n⁻-type silicon layer 2 transforms into a p⁺-type silicon region (impurity semiconductor region) 22 having the same conductivity type as the p⁺-type silicon layer 21. Note that the implanted impurity is used to form an impurity semiconductor region 22 having the same conductivity type as the p⁺-type silicon layer 21 to serve as a first impurity semiconductor layer, and can be, for example, boron or boron difluoride. After impurity implantation and resist pattern removal, annealing can be performed so that the p⁺-type silicon layer 21 formed under the n⁻-type silicon layer 2 becomes continuous with the substrate surface.

In step S204, the resist pattern is removed, and then the impurity semiconductor region 22 and p⁺-type silicon layer 21 are anodized using the silicon nitride 3 as a mask to transform the p⁺-type silicon layer 21 into a first porous silicon layer 5. The practical conditions used in step S204 are the same as in step S104. The same processes as in steps S105 to S112 shown in FIGS. 1B to 1D can be performed subsequently.

The semiconductor device according to the second embodiment can be, for example, a back-side illumination solid-state image sensor having, as its light incident surface, a surface on which a porous silicon oxide layer is formed. In the second embodiment, the p⁺-type silicon layer 21 is provided on the back-side surface of the n⁻-type silicon layer 2 as well to surround the n⁻-type silicon layer 2 as a whole. Because a p⁺-type silicon layer is more likely to form a porous structure than a p⁻-type silicon layer, a porous silicon layer can be formed within a shorter period of time and/or at a lower current density. This improves the selection ratio of porous structure formation on the back-side surface of the n⁻-type silicon layer 2, thus making it possible to more precisely control the thickness of the single-crystal silicon layer (n⁻-type silicon layer 2) on the porous silicon layer 5.

Third Embodiment

Figure 3A:
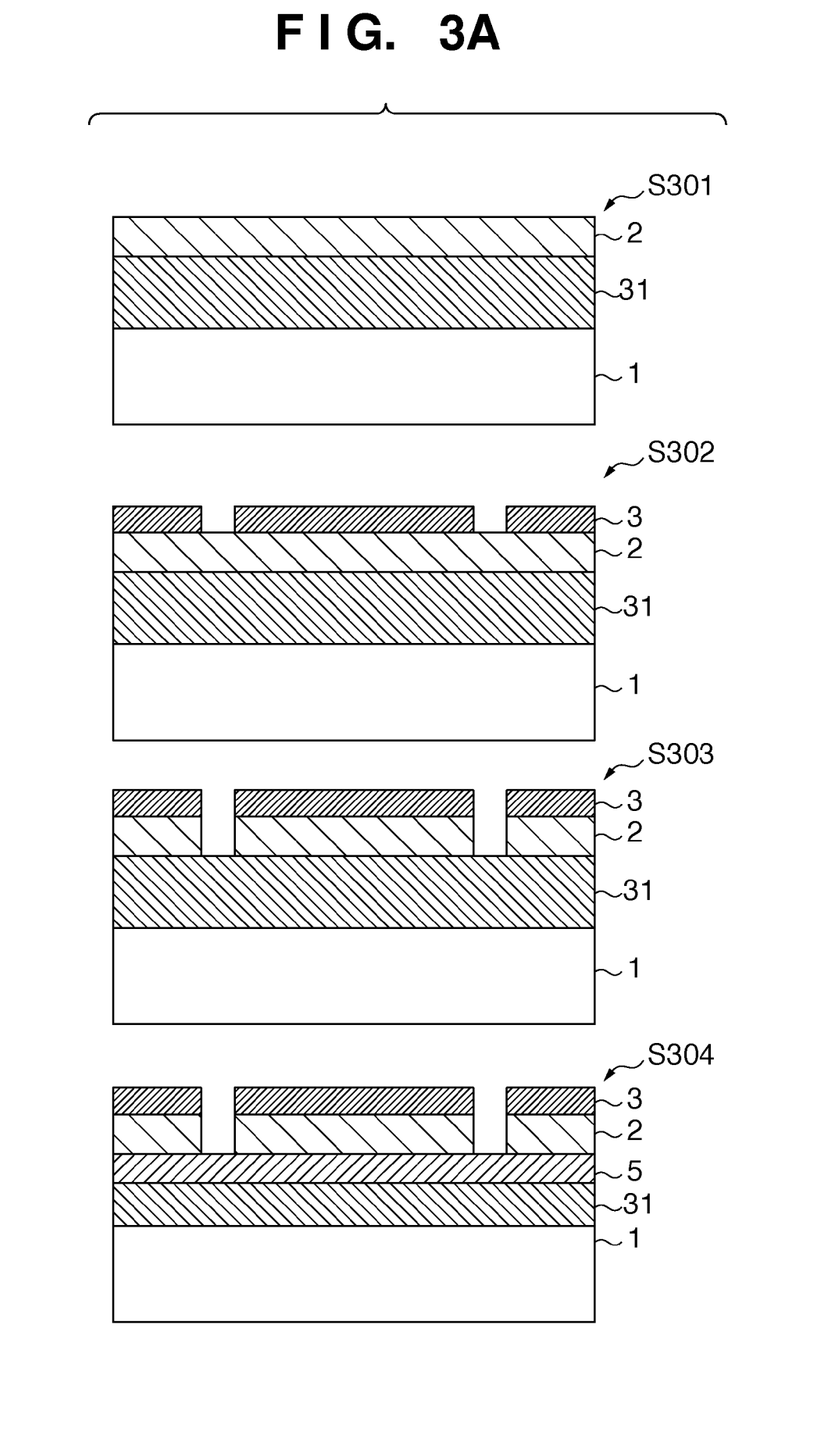
FIG. 3A is a view showing a step in a method of manufacturing a semiconductor device according to the third embodiment of the present invention.
Figure 3B:
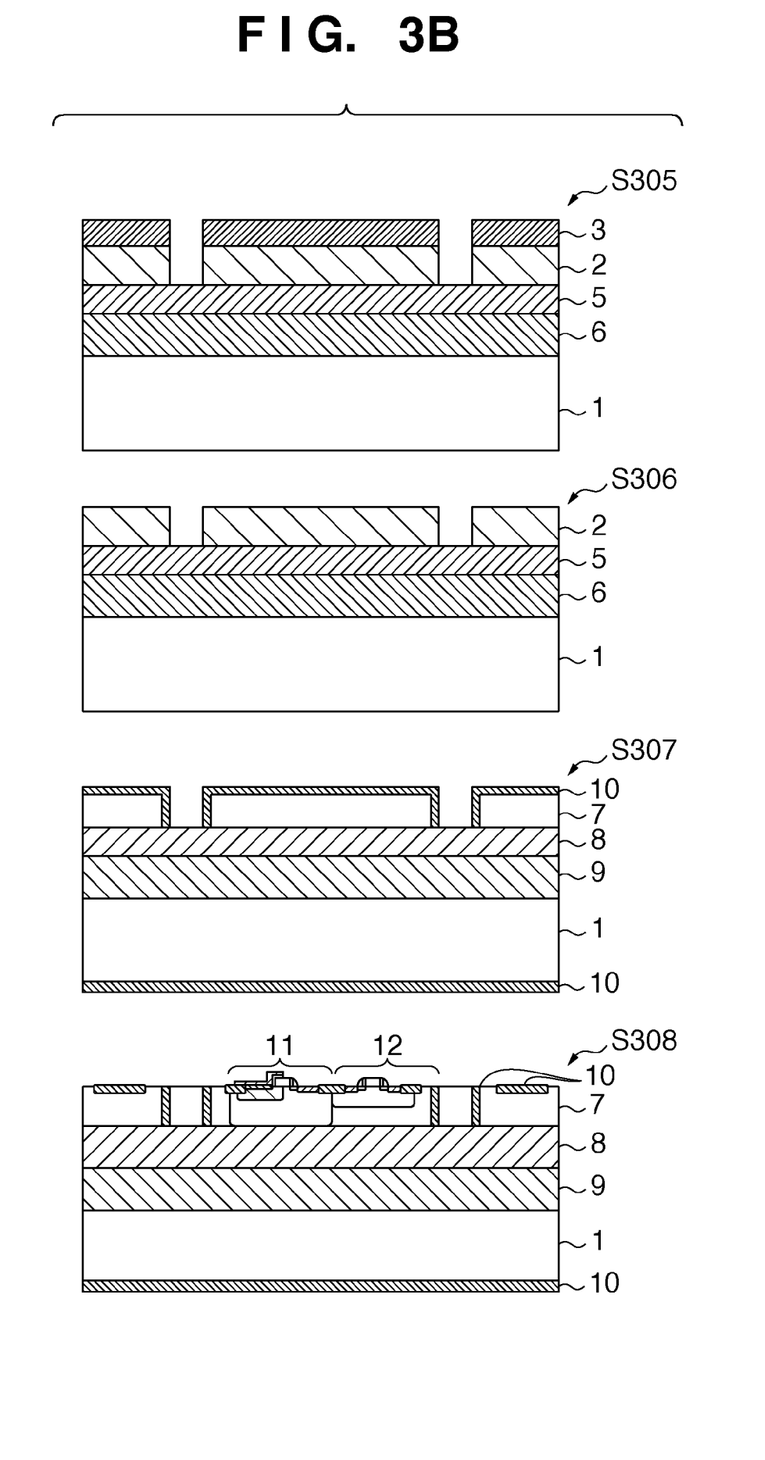
FIG. 3B is a view showing a step in the method of manufacturing a semiconductor device according to the third embodiment of the present invention.

A method of manufacturing a semiconductor device according to the third embodiment of the present invention will be described with reference to FIGS. 3A and 3B. In step S301, an n⁺-type silicon substrate 31 to serve as a first impurity semiconductor layer and an n⁻-type silicon layer 2 to serve as a second impurity semiconductor layer are formed on the surface of an n⁻-type silicon substrate 1 in this order. The first and second impurity semiconductor layers can be formed by, for example, ion implantation or epitaxial growth. The first and second impurity semiconductor layers have different impurity concentrations.

In step S302, silicon nitride 3 is deposited on the n⁻-type silicon layer 2, then a resist pattern (not shown) is formed on it, and the silicon nitride 3 is partially etched using the resist pattern as a mask to expose a partial region of the n⁻-type silicon layer 2. The practical conditions under which the silicon nitride 3 is etched are the same as in step S102.

In step S303, a partial region of the n⁻-type silicon layer 2 is etched using the silicon nitride 3, obtained after the resist pattern is removed, or both the resist pattern and the silicon nitride 3 as a mask to expose a partial region of the n⁺-type silicon substrate 31. If both the resist pattern and the silicon nitride 3 are used as a mask, part of the n⁺-type silicon substrate 31 can be exposed, for example, by dipole ring magnetron (DRM) plasma etching in a mixed gas containing sulfur hexafluoride/oxygen. The same result can also be obtained by the Bosch process in which etching is performed while alternately supplying sulfur hexafluoride and chlorofluorocarbon 318C ($C_4F_8$) using an inductively coupled plasma (ICP). On the other hand, if only the silicon nitride 3 is used as a mask, wet etching which uses, for example, potassium hydroxide, TMAH (tetramethylammonium hydride), fluoronitric acid, or a mixed solution containing fluoronitric acid/acetic acid, for example, is applicable as well as the above-mentioned various types of plasma etching.

In step S304, part of the n⁺-type silicon substrate 31 is anodized using the silicon nitride 3 as a mask to transform it into a first porous silicon layer 5. The anodization conditions used in step S304 are the same as in step S104, but the remaining part of the n⁺-type silicon substrate 31 is prevented from forming a porous structure by adjusting the processing time. The n⁺-type silicon substrate 31 and n⁻-type silicon layer 2 have different impurity concentrations, so the n⁺-type silicon substrate 31 is selectively allowed to form a porous structure.

In step S305, a second porous silicon layer 6 with a pore density different from that of the first porous silicon layer 5 is formed under it by the second anodization operation. Typically, in step S305, anodization is performed at a current density higher than that used in step S304. Thus, a porous silicon layer 6 with a pore density higher than the porous silicon layer 5 formed in step S304 is obtained. In step S306, the silicon nitride 3 is separated by etching, and this step can be performed under the same conditions as in step S106.

In step S307, the first porous silicon layer 5 is transformed into a first porous silicon oxide layer 8, and the second porous silicon layer 6 is transformed into a second porous silicon oxide layer 9, both by thermal oxidation. In this step, a silicon oxide film 10 is formed on the front-side surface and side surfaces of a single-crystal silicon layer 7. Again in this step, the same oxidation conditions as in step S107 are applicable.

Figure 3C:
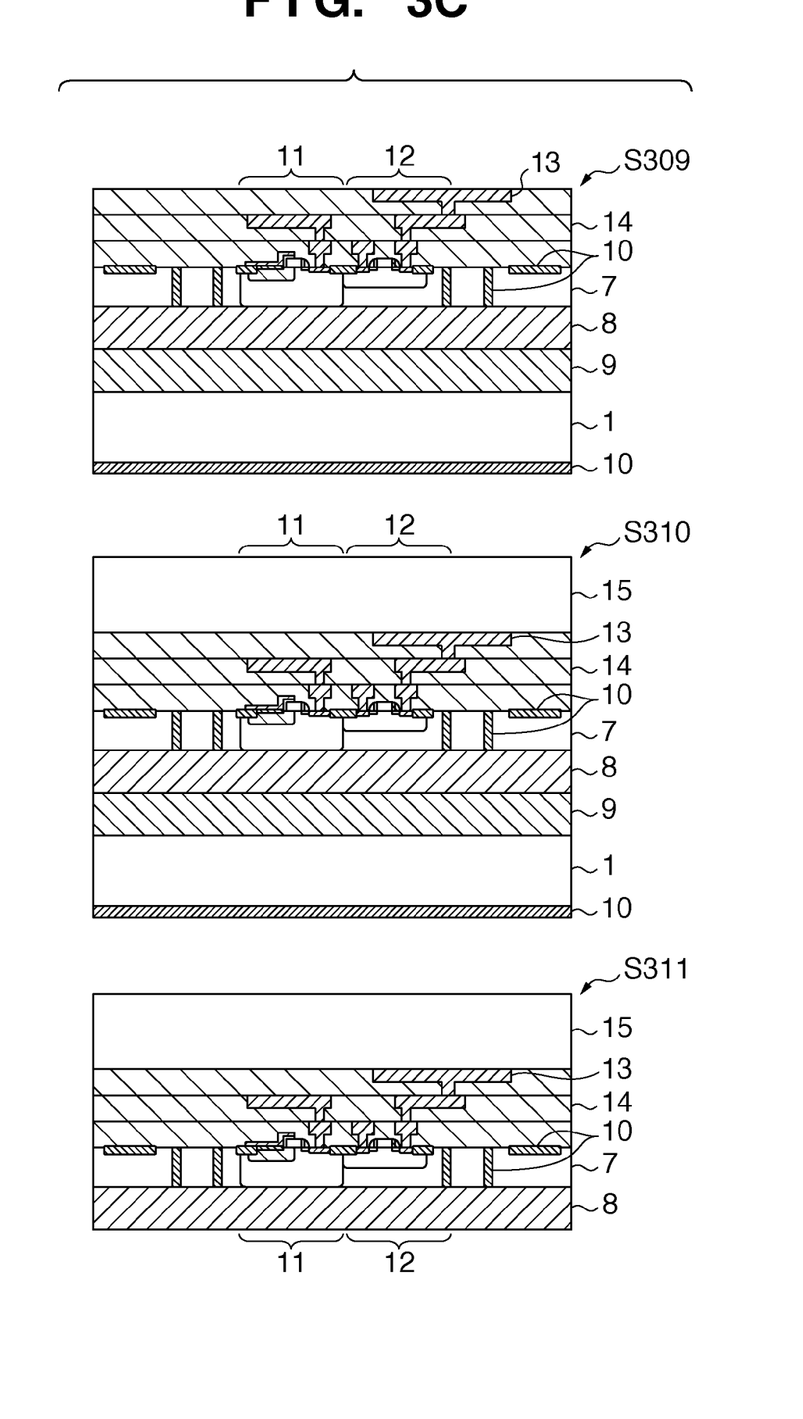
FIG. 3C is a view showing a step in the method of manufacturing a semiconductor device according to the third embodiment of the present invention.
Figure 3D:
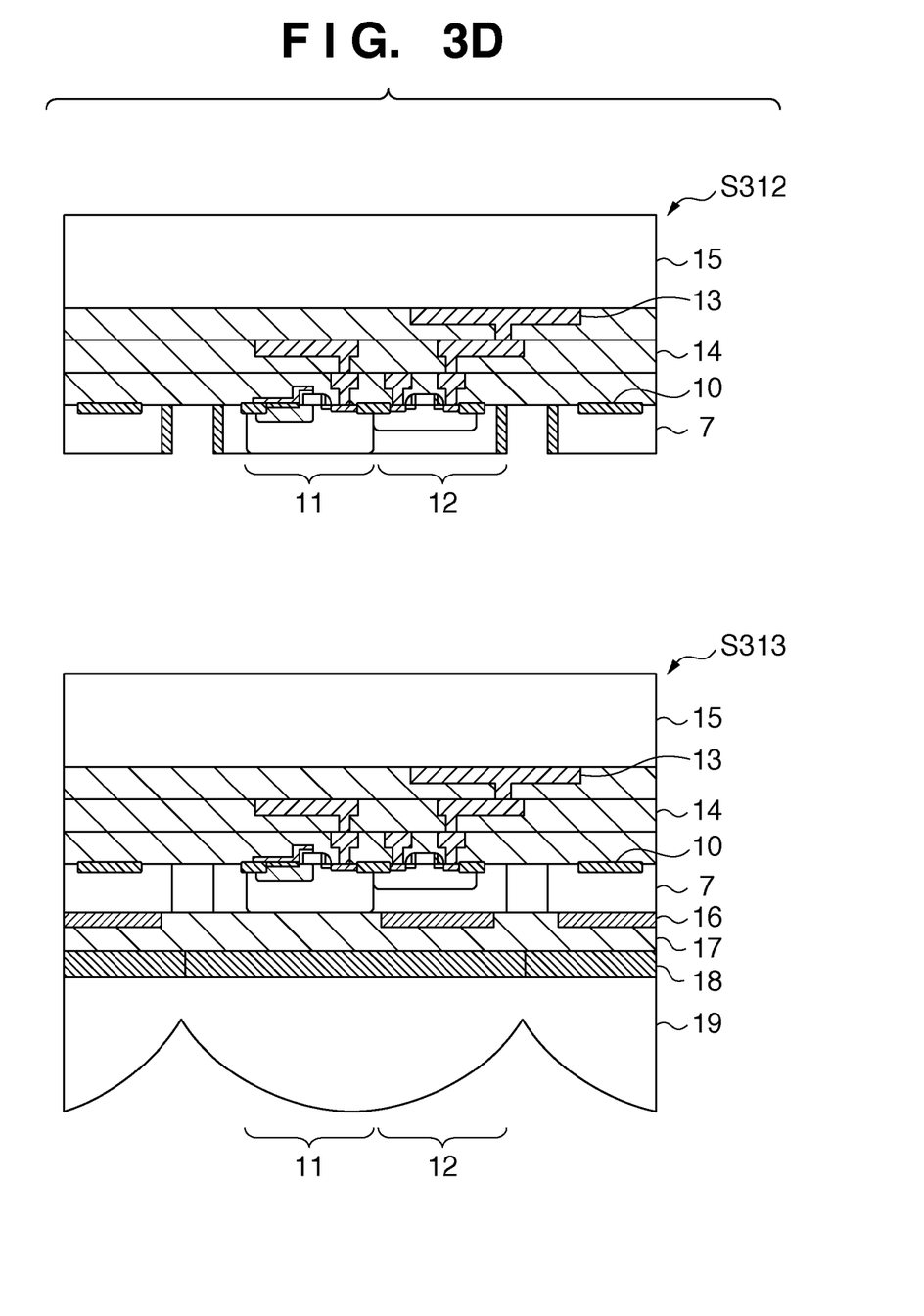
FIG. 3D is a view showing a step in the method of manufacturing a semiconductor device according to the third embodiment of the present invention.

Steps S308 to S311 are the same as steps S108 to S111, respectively, and can be performed under the same conditions as in the first embodiment. In step S312, the first porous silicon oxide layer 8 on the back-side surface of the single-crystal silicon layer 7, and the silicon oxide film 10 on its side surfaces are removed. The porous silicon oxide layer and the silicon oxide film can be selectively removed under the same conditions as in step S112. Step S313 is the same as step S113, and in this step a semiconductor device having a thin silicon layer can be obtained under the same conditions as in the first embodiment.

The semiconductor device according to the third embodiment can be, for example, a back-side illumination solid-state image sensor having, as its light incident surface, a surface on which a porous silicon oxide layer was formed. In the third embodiment, upon oxidizing the porous silicon layer, both the front-side surface and side surfaces of the single-crystal silicon layer are oxidized at once. Hence, in the step of forming a semiconductor element and a multilayer wiring structure, the side surfaces of the single-crystal silicon layer are not directly exposed. Therefore, the side surfaces of the single-crystal silicon layer become less susceptible to electrical damage inflicted by a plasma process and chemical damage inflicted by a wet process which uses a chemical solution. This makes it possible to suppress deterioration in characteristic of a semiconductor element (for example, a photoelectric conversion element and a transistor) formed in the single-crystal silicon layer.

Although an $n^+$-type silicon layer is formed as a first impurity semiconductor layer in the third embodiment, a $p^+$-type silicon layer may be formed.

Fourth Embodiment

Figure 4:
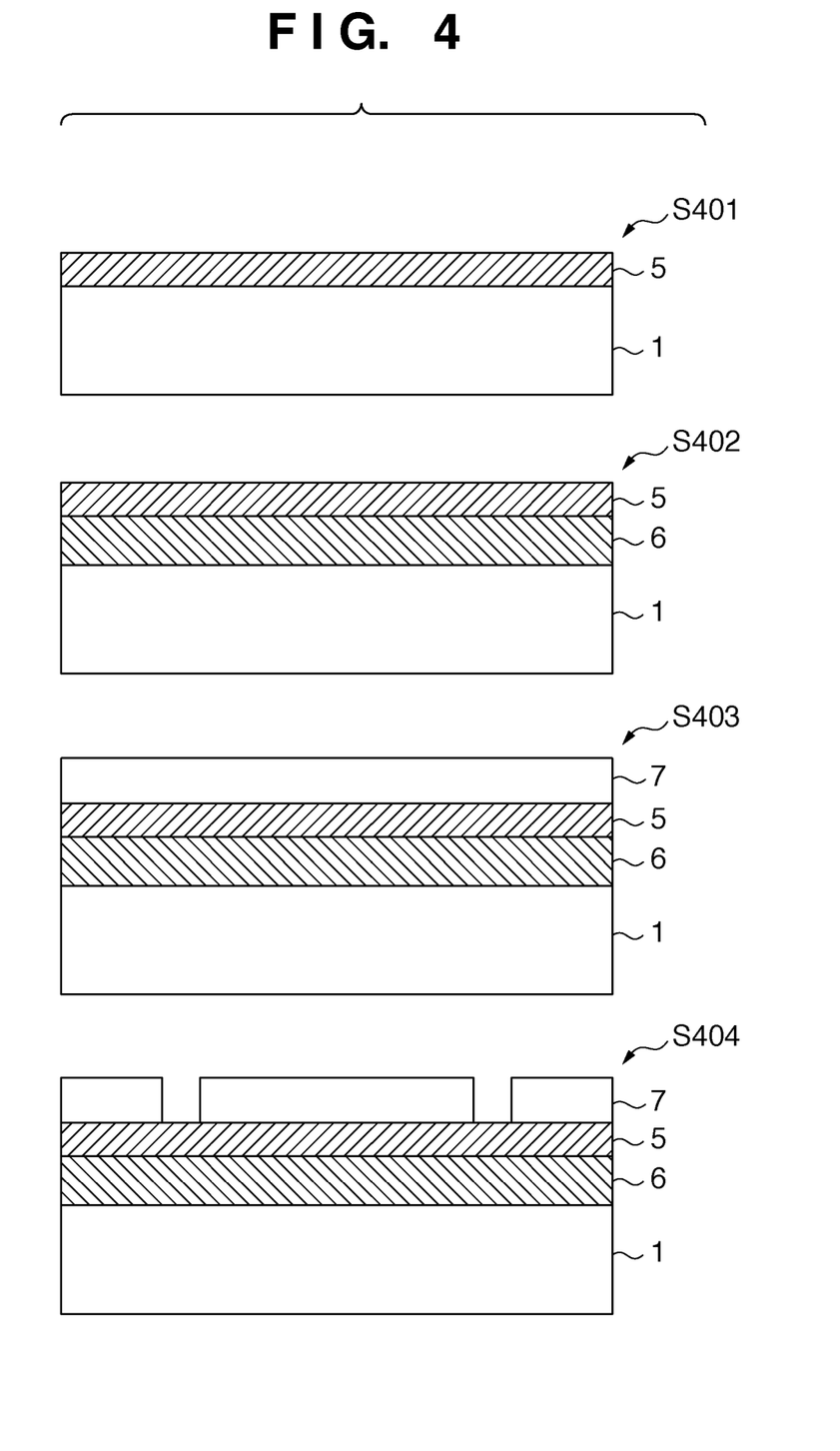
FIG. 4 shows views of steps in a method of manufacturing a semiconductor device according to the fourth embodiment of the present invention.

A method of manufacturing a semiconductor device according to the fourth embodiment of the present invention will be described with reference to FIG. 4. In step S401, the surface of a $p^+$-type silicon substrate 1 is anodized to form a first porous silicon layer 5 on it. This step can be performed under the same conditions as in step S104. In step S402, a second porous silicon layer 6 with a pore density different from that of the first porous silicon layer 5 is formed under it by the second anodization operation. This step can be performed under the same conditions as in step S105.

In step S403, a single-crystal silicon layer (non-porous semiconductor layer) 7 is formed on the first porous silicon layer 5. The single-crystal silicon layer 7 can be formed by, for example, the epitaxial growth method. More specifically, the single-crystal silicon layer 7 can be formed, for example, at a temperature of 900 to 1,200° C. and a pressure of 1.0 to 101.3 kPa in a silane-based gas or a mixed gas containing a silane-based gas/hydrogen gas. Note that the surface of the first porous silicon layer 5 may be smoothened by annealing in hydrogen before epitaxial growth. At this time, annealing is generally performed at a temperature equal to or higher than that at which epitaxial growth takes place.

In step S404, a resist pattern (not shown) is formed, and then the single-crystal silicon layer 7 is etched to reach the first porous silicon layer 5 using the resist pattern as a mask to form openings in the single-crystal silicon layer 7. The method exemplified in reference to step S303, for example, is applicable to etching of the single-crystal silicon layer. Steps subsequent to step S404 are the same as steps S307 to S312, and in these steps a semiconductor device having a thin silicon layer can be obtained under the same conditions as in the third embodiment.

The semiconductor device according to the fourth embodiment can be, for example, a back-side illumination solid-state image sensor having, as its light incident surface, a surface on which a porous silicon oxide layer is formed. In the fourth embodiment, a porous silicon layer is formed on the entire surface of the silicon substrate, and then a single-crystal silicon layer is formed on it. This eliminates process constraints such as the preparation of an n-type single-crystal silicon layer, thus making it possible to increase the degree of freedom of a semiconductor element to be formed.

Fifth Embodiment

Figure 5:
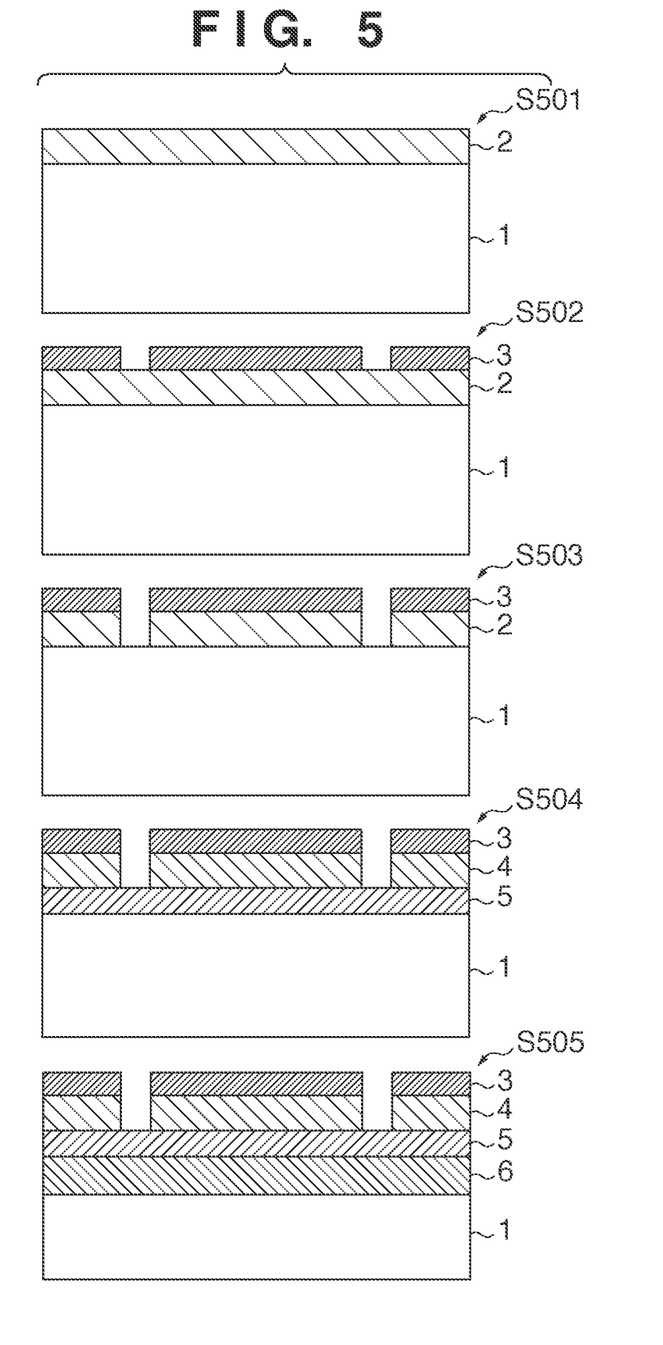
FIG. 5 is a view showing a step in a method of manufacturing a semiconductor device according to the fifth embodiment of the present invention.

A method of manufacturing a semiconductor device according to the fifth embodiment of the present invention will be described with reference to FIG. 5. In step S501, an n-type silicon layer 2 to serve as a first impurity semiconductor layer is formed on the surface of a p-type silicon substrate 1 by, for example, the ion implantation method or the epitaxial growth method. This step can be performed under the same conditions as in step S101. In step S502, silicon nitride 3 is deposited on the n-type silicon layer 2, then a resist pattern (not shown) is formed on it, and a partial region of the silicon nitride 3 is etched using the resist pattern as a mask to expose a partial region of the n-type silicon layer 2. This step can be performed under the same conditions as in step S102.

In step S503, a partial region of the n-type silicon layer 2 is etched using the silicon nitride 3, obtained after the resist pattern is removed, or both the resist pattern and the silicon nitride 3 as a mask to expose a partial region of the p-type silicon substrate 1. Selective etching which uses, for example, the pulsed current anodic oxidation method in a solution containing potassium hydroxide can be used to etch the n-type silicon layer 2. It is also possible to apply etching exemplified in reference to step S502.

In step S504, the p-type silicon substrate 1 is anodized using the silicon nitride 3 or both the resist pattern and the silicon nitride 3 as a mask to form a first porous silicon layer 5 on it. This step can be performed under the same conditions as in step S104. In step S505, a second porous silicon layer 6 with a pore density different from that of the first porous silicon layer 5 is formed under it by the second anodization operation. This step can be performed under the same conditions as in step S105. Steps subsequent to step S504 are the same as steps S306 to S313, and in these steps a semiconductor device having a thin silicon layer can be obtained under the same conditions as in the third embodiment.

The semiconductor device according to the fifth embodiment can be, for example, a back-side illumination solid-state image sensor having, as its light incident surface, a surface on which a porous silicon oxide layer is formed. In the fifth embodiment, selective formation of the first porous silicon layer 5 is realized by forming only a first impurity semiconductor layer on the surface of the silicon substrate 1. This is advantageous to shorten the TAT (Turn Around Time) and reduce the cost by decreasing the number of steps.

Sixth Embodiment

Figure 6:
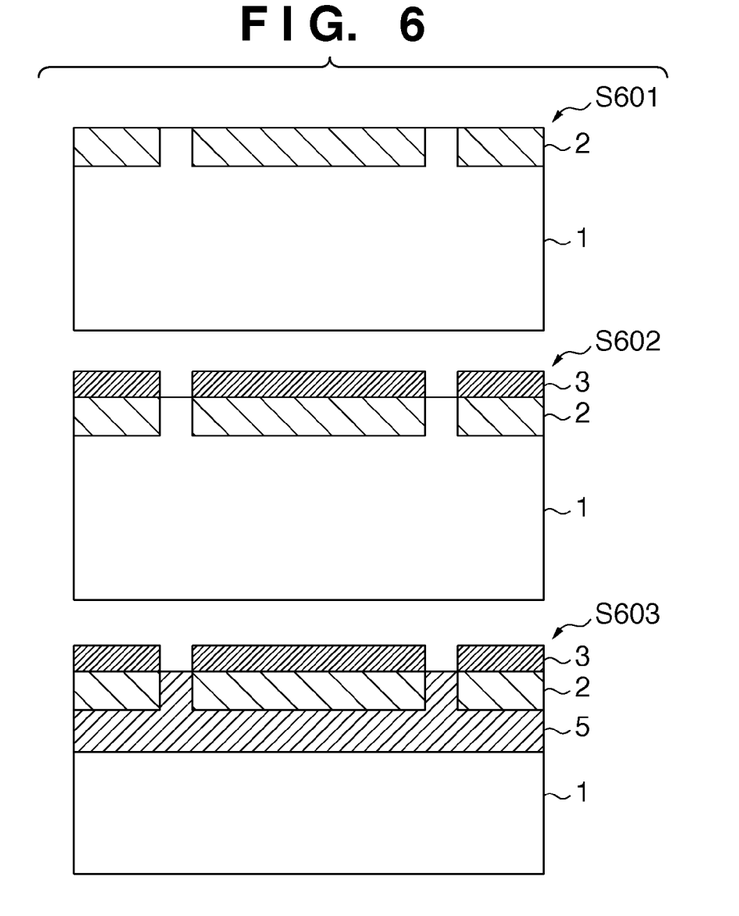
FIG. 6 shows views of steps in a method of manufacturing a semiconductor device according to the sixth embodiment of the present invention.

A method of manufacturing a semiconductor device according to the sixth embodiment of the present invention will be described with reference to FIG. 6. In step S601, a resist pattern (not shown) is formed on a p-type silicon substrate 1, and ions are implanted into a partial region of the p-type silicon substrate 1 using the resist pattern as a mask to form an n-type silicon layer 2 to serve as an impurity semiconductor layer. After formation of the n-type silicon layer 2, the resist pattern is removed. In step S602, silicon nitride 3 is deposited on the n-type silicon layer 2, a new resist pattern is formed on it, and the silicon nitride 3 is etched using this resist pattern as a mask to expose another partial region of the p-type silicon substrate 1. This step can be performed under the same conditions as in step S102.

In step S603, the resist pattern is removed, and then another partial region of the p-type silicon substrate 1 and the lower portion of the n-type silicon layer 2 are anodized using the silicon nitride 3 as a mask to form a first porous silicon layer 5 on the p-type silicon substrate 1. This step can be performed under the same conditions as in step S104. Steps subsequent to step S603 are the same as steps S105 to S113, and in these steps a semiconductor device having a thin silicon layer can be obtained under the same conditions as in the first embodiment.

The semiconductor device according to the sixth embodiment can be, for example, a back-side illumination solid-state image sensor having, as its light incident surface, a surface on which a porous silicon oxide layer is formed. In the sixth embodiment, selective formation of the first porous silicon layer 5 is realized by forming only a first impurity semiconductor layer on the surface of the silicon substrate 1. This is advantageous to shorten the TAT (Turn Around Time) and reduce the cost by decreasing the number of steps. Also, because the single-crystal silicon layer is not etched, no damage is inflicted on the element formation surface, and it is possible to suppress deterioration in characteristic of an element to be formed.

Seventh Embodiment

Figure 7:
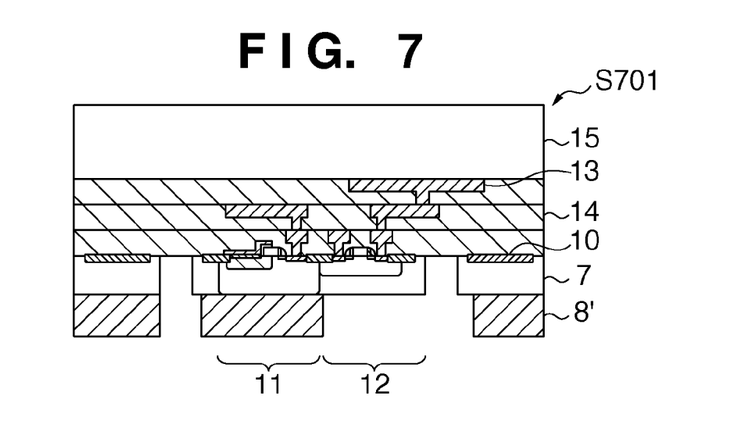
FIG. 7 is a view showing a step in a method of manufacturing a semiconductor device according to the seventh embodiment of the present invention.

A method of manufacturing a semiconductor device according to the seventh embodiment of the present invention will be described with reference to FIG. 7. In the seventh embodiment, steps S101 to S111 in the first embodiment are performed, and then step S701 is performed. In step S701, a first porous silicon oxide layer 8 is patterned. More specifically, in step S701, for example, a resist pattern is formed to cover the first porous silicon oxide layer 8, and the first porous silicon oxide layer 8 can be patterned by plasma etching using this resist pattern as a mask. It is also possible to coat a resin having resistance to hydrofluoric acid on the first porous silicon oxide layer 8 and perform wet etching which uses a solution containing hydrogen fluoride. After that, a supporting substrate 15 is diced using, for example, a blade or a laser, and a semiconductor device having a thin silicon layer can be obtained.

The semiconductor device according to the seventh embodiment can be, for example, a back-side illumination solid-state image sensor having, as its light incident surface, a surface on which a porous silicon oxide layer is formed. When the second embodiment is applied to a back-side illumination solid-state image sensor, a porous silicon oxide layer 8' is formed on a photodiode serving as a semiconductor element. Hence, light with a specific wavelength can efficiently be focused on the photodiode by utilizing the difference in optical refractive index between the porous silicon oxide layer 8' and a single-crystal silicon layer 7.

A semiconductor device having a porous silicon oxide layer formed on a single-crystal silicon layer, as in the seventh embodiment, is not limited to a solid-state image sensor. This semiconductor device can realize, for example, a light-emitting device which utilizes light emission by the porous silicon layer, a storage device which uses the porous silicon oxide layer as a high-capacity capacitor, and a power supply device which uses the porous silicon oxide layer as a heat sink. Although the porous silicon oxide layer on the side surfaces of the single-crystal silicon layer 7 is removed in the seventh embodiment, a semiconductor device in which the porous silicon oxide layer is intentionally left in this portion can also be fabricated.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-150256, filed Jun. 30, 2010, which is hereby incorporated by reference herein in its entirety.

What is claimed is:

1. A method of manufacturing a semiconductor device, comprising the steps of:
providing a substrate including a semiconductor portion, a non-porous semiconductor layer, and a porous semiconductor layer arranged between the semiconductor portion and the non-porous semiconductor layer;
forming a porous oxide layer by oxidizing the porous semiconductor layer of the substrate provided by the step of providing the substrate;
forming a bonded substrate by bonding a supporting substrate to a surface, on a side of the non-porous semiconductor layer, of the substrate in which the porous oxide layer is formed; and
separating the semiconductor portion from the bonded substrate by utilizing the porous oxide layer,
wherein the step of providing the substrate includes the step of forming, by ion implantation, an impurity semiconductor region which has an exposed surface and extends through the non-porous semiconductor layer and reaches the semiconductor portion.

2. The method according to claim 1, wherein
the step of providing the substrate includes the step of forming an impurity semiconductor layer to serve as the non-porous semiconductor layer on a semiconductor member,
the step of forming the impurity semiconductor layer is performed such that the impurity semiconductor region is formed in the impurity semiconductor layer, and
the step of providing the substrate further includes anodizing, through the exposed surface of the impurity semiconductor region, the impurity semiconductor region and part of the semiconductor member to change the impurity semiconductor region and the part of the semiconductor member into a porous structure such that the semiconductor portion is formed by another part of the semiconductor member, and
wherein the semiconductor member and the impurity semiconductor region have a first conductivity type, and the impurity semiconductor layer has a second conductivity type different from the first conductivity type.

3. The method according to claim 1, wherein
the step of providing the substrate includes the steps of
forming a first impurity semiconductor layer on the semiconductor portion, and
forming a second impurity semiconductor layer on the first impurity semiconductor layer,
the step of forming the impurity semiconductor region is performed such that a partial region of the second impurity semiconductor layer is transformed into the impurity semiconductor region having a conductivity type identical to a conductivity type of the first impurity semiconductor layer by implanting an impurity into the partial region of the second impurity semiconductor layer, and
the step of providing the substrate further includes anodizing, through the exposed surface of the impurity semiconductor region, the impurity semiconductor region and the first impurity semiconductor layer to change the impurity semiconductor region and the first impurity semiconductor layer into a porous structure.

4. The method according to claim 2, wherein the porous semiconductor layer provided in the step of providing the substrate includes a first porous semiconductor layer, and a second porous semiconductor layer having a pore density different from a pore density of the first porous semiconductor layer.

* * * * *